United States Patent
Wu

(10) Patent No.: US 6,625,347 B1
(45) Date of Patent: Sep. 23, 2003

(54) PUMPS FOR RAMAN AMPLIFIER SYSTEMS

(75) Inventor: Yongan Wu, San Jose, CA (US)

(73) Assignee: Onetta, Inc., Sunnyvale, CA (US)

(*) Notice: Subject to any disclaimer, the term of this patent is extended or adjusted under 35 U.S.C. 154(b) by 359 days.

(21) Appl. No.: 09/798,927

(22) Filed: Mar. 6, 2001

Related U.S. Application Data

(60) Provisional application No. 60/260,897, filed on Jan. 12, 2001.

(51) Int. Cl.[7] .................................................. H01S 3/30
(52) U.S. Cl. ........................................... 385/27; 372/3
(58) Field of Search ............................. 385/27; 372/3, 372/6, 27, 37, 69; 359/139, 334, 341.3

(56) References Cited

U.S. PATENT DOCUMENTS

| | | | |
|---|---|---|---|
| 4,881,790 A | 11/1989 | Mollenauer | 350/96.16 |
| 5,623,508 A | 4/1997 | Grubb et al. | 372/3 |
| 5,673,280 A | 9/1997 | Grubb et al. | 372/3 |
| 5,959,750 A | 9/1999 | Eskildsen et al. | 359/134 |
| 6,052,393 A | 4/2000 | Islam | 372/6 |
| 6,115,174 A | 9/2000 | Grubb et al. | 359/334 |
| 6,147,794 A | 11/2000 | Stentz | 359/334 |
| 6,151,160 A | 11/2000 | Ma et al. | 359/341 |
| 6,163,636 A | 12/2000 | Stentz et al. | 385/24 |
| 6,178,038 B1 | 1/2001 | Taylor et al. | 359/341 |
| 6,181,464 B1 | 1/2001 | Kidorf et al. | 359/334 |
| 6,275,313 B1 | 8/2001 | Denkin et al. | 359/124 |

FOREIGN PATENT DOCUMENTS

| | | |
|---|---|---|
| WO | WO 99/66607 | 12/1999 |
| WO | WO 00/49721 | 8/2000 |
| WO | WO 00/73849 A1 | 12/2000 |

OTHER PUBLICATIONS

Zhu et al. "1.28 Tbit/s (32×40 Gbit/s) Transmission over 1000 km NDSF Employing Distributed Raman Amplification and Active Gain Flattening" Electronics Letters, vol. 37, No. 1, p. 43–45 (Jan. 4, 2000).

(List continued on next page.)

*Primary Examiner*—Walter E. Snow
(74) *Attorney, Agent, or Firm*—G. Victor Treyz

(57) ABSTRACT

Raman amplifiers are provided for amplifying signals on optical communications links. The Raman amplifiers may be pumped using an unpolarized Raman pump source. Gain for the source may be provided by a semiconductor device that provides linearly-polarized pump light. A polarization-maintaining fiber may be coupled directly to the semiconductor device at a 45° orientation with respect to the polarization of the light emitted by the device. Light from the semiconductor device may be launched equally into both the slow and fast axes of the fiber. A fiber Bragg grating reflector may be used to stabilize the pump. Pump light traveling along the slow and fast axes becomes spatially separated by more than the coherence length of the multiple quantum well device. The pump light exiting the end of the polarization-maintaining fiber is therefore unpolarized.

26 Claims, 12 Drawing Sheets

OTHER PUBLICATIONS

Emori et al., "Cost–Effictive Depolarization Diode Pump Unit Designed for C–band Flat Gain Raman Amplifiers to Control EDFA Gain Profile" p. 106–108.

Takeda et al. "Active Gain Tilt Equalization by Preferentially 1.43 µm– or 1.48µm– Pumped Raman Amplification" OSA Optical Amplifiers and their Applications, vol. 30, p. 101–105 (1999).

Masuda "Review of Wideband Hybrid Amplifiers" 25th Optical Fiber Communication Conference, Technical Digest, p. 2–4, (Mar. 7, 2000).

Lewis et al. "Low–Noise High Gain Dispersion Compensating Broadband Raman Amplifier" 25th Optical Fiber Communication Conference, Technical Digest, p. 5–7, (Mar. 7, 2000).

Fludger et al. "Inline Loopbacks for Improved OSNR and Reduced Double Rayleigh Scattering in Distributed Raman Amplifiers" OFC.

Stentz "Progress on Raman Amplifiers" OFC '97 Technical Digest, p. 343.

Hansen et al. "Raman Amplification for Loss Compensation in Dispersion Compensating Fibre Modules" Electronics Letters, vol. 34, No. 11, p. 1136–1137, May 28, 1998.

Emori et al. "Broadband Lossless DCF using Raman Amplification Pumped by Multichannel WDM Laser Diodes" Electronics Letters, vol. 34, No. 22, Oct. 29, 1998.

Neilson et al. "10 Gbit/s Repeaterless Transmission at 1.3 µm with 55.1–dB Power Budget using Raman Post and Preamplifier" OFC '98 Technical Digest, p. 52–53.

Stentz et al. "Raman Amplifier with Improved System Performance" OFC '96 Technical Digest, p. 16–17.

PUMPS FOR RAMAN AMPLIFIER SYSTEMS

This application claims the benefit of provisional patent application No. 60/260,897, filed Jan. 12, 2001.

BACKGROUND OF THE INVENTION

The present invention relates to fiber-optic communications networks, and more particularly, to pump systems for Raman amplifiers in fiber-optic communications networks.

Fiber-optic networks are used to support voice and data communications. In optical networks that use wavelength division multiplexing, multiple wavelengths of light are used to support multiple communications channels on a single fiber.

Optical amplifiers are used in fiber-optic networks to amplify optical signals. For example, optical amplifiers may be used to amplify optical data signals that have been subject to attenuation over fiber-optic links. A typical amplifier may include erbium-doped fiber coils that are pumped with diode lasers. Raman amplifiers have also been investigated. Discrete Raman amplifiers may use coils of fiber to provide Raman gain. Distributed Raman amplifiers provide gain in the transmission fiber spans that are used to carry optical data signals between network nodes.

Raman amplifiers may be pumped by linearly-polarized laser diodes. However, if a Raman amplifier is pumped with a single linearly-polarized laser diode, the Raman gain will exhibit a polarization dependence. With this arrangement, optical signals with different polarizations will be amplified by different amounts. Because polarization dependent gain is undesirable, Raman pumps often are formed using two linearly-polarized lasers that are combined using a polarization beam combiner. With this type of arrangement, the combined pumped signal is unpolarized and is suitable for pumping a Raman amplifier. However, this type of arrangement requires two Raman pumps and a polarization beam combiner.

Another approach for forming a polarization-independent Raman pump source involves using laser diode devices that are stabilized with external fiber gratings. In a typical pump of this type, a first polarization-maintaining fiber with a fiber grating is coupled to a multiple-quantum well device. The light exiting this first polarization-maintaining fiber is linearly polarized. To unpolarized this light, the first polarization-maintaining fiber is spliced to a second polarization-maintaining fiber. The first and second polarization-maintaining fibers are oriented so that their principle axes meet at a 45° angle at the splice. With this arrangement, light that is launched from the first polarization-maintaining fiber into the second polarization-maintaining fiber is equally coupled into both the slow and fast principle axes of the second polarization-maintaining fiber.

The second polarization-maintaining fiber is typically a few meters in length. After the pump light passes through this length of fiber, the signals traveling along the slow and fast axes become spatially separated by a length that is greater than the coherence length of the multiple quantum well device. As a result, when the pump light exits the end of the second polarization-maintaining fiber, the light is unpolarized. This unpolarized light may be used to pump fiber in a Raman amplifier. However, it is difficult to form the 45° splice between the first and second polarization-maintaining fibers.

It is therefore an object of the present invention to provide Raman amplifier pump systems that provide unpolarized light for Raman amplifiers.

It is also an object of the present invention to provide Raman amplifier pump systems in which a polarization-maintaining fiber is coupled directly to a multiple quantum well device at an orientation that allows light from the multiple quantum well device to be launched about equally into both the slow and fast axes of the fiber.

SUMMARY OF THE INVENTION

These and other objects of the invention are accomplished in accordance with the present invention by providing Raman amplifiers for amplifying signals on optical communications links. The communications links may support channels operating at one or more different wavelengths. The Raman amplifier equipment may be based on distributed or discrete Raman amplifiers.

The Raman amplifiers may be pumped using an unpolarized source of pump light. The unpolarized source may be formed using a polarization-maintaining fiber. Gain for the source may be provided by a semiconductor device such as a multiple quantum well device that provides linearly-polarized pump light. The polarization-maintaining fiber may be coupled directly to the multiple quantum well device at a 45° orientation with respect to the polarization of the light emitted by the multiple quantum well device. This configuration allows light from the multiple quantum well device to be launched equally into both the slow and fast axes of the fiber. The polarization-maintaining fiber may have a fiber Bragg grating reflector for forming an external cavity laser based on the multiple quantum well device.

The grating on the polarization-maintaining fiber may be located a few meters from the multiple quantum well device. After the light from the multiple quantum well device has passed through this length of fiber, the signals traveling along the slow and fast axes become spatially separated by a length that is greater than the coherence length of the multiple quantum well device. As a result, when the pump light exits the end of the polarization-maintaining fiber, the light is unpolarized. This unpolarized light may be used to pump fiber in a Raman amplifier.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
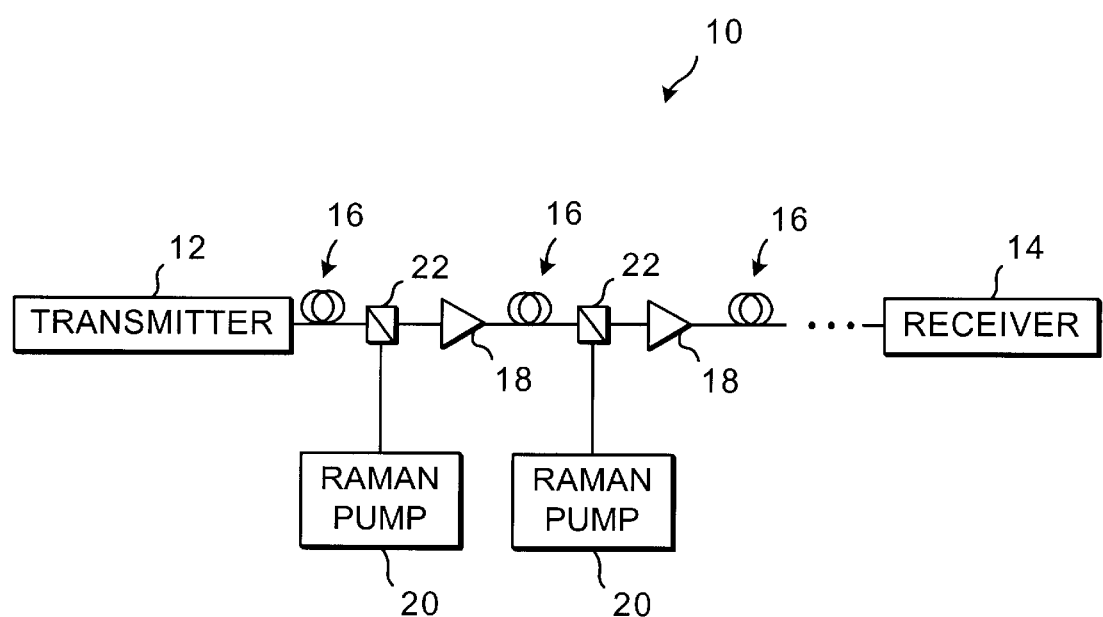
FIG. 1 is a schematic diagram of an illustrative fiber-optic communications link including Raman amplifier equipment in accordance with the present invention.

An illustrative optical communications network link 10 with Raman amplifier equipment in an optical communications network in accordance with the present invention is shown in FIG. 1. A transmitter 12 may transmit information to a receiver 14 over a series of fiber links. Each fiber link may include a span 16 of optical transmission fiber. Fiber spans may be on the order of 40–160 km in length for long-haul networks or may be any other suitable length for use in signal transmission in an optical communications network.

The communications link of FIG. 1 may be used to support wavelength division multiplexing arrangements in which multiple communications channels are provided using multiple wavelengths of light. For example, the link of FIG. 1 may support a system with 40 channels, each using a different optical carrier wavelength. Optical channels may be modulated at, for example, approximately 10 Gbps (OC-192). The carrier wavelengths that are used may be in the vicinity of 1520–1565 nm. These are merely illustrative system characteristics. If desired, a single channel may be provided or more channels may be provided (e.g., hundreds of channels), signals may be modulated at slower or faster data rates (e.g., at approximately 2.5 Gbps for OC-48 or at approximately 40 Gbps for OC-768), and different carrier wavelengths may be supported (e.g., wavelengths in the range of 1240–1650 nm).

Optical amplifiers 18 may be used to amplify optical signals between successive spans of fiber 16. Optical amplifiers 18 may be based on erbium-doped amplifier stages or other rare-earth-doped fiber amplifier stages, may be based on semiconductor optical amplifier stages, may be based on discrete Raman amplifier stages, may be based on other suitable amplifier stages, or may be based on combinations of such stages.

Fiber spans 16 may be Raman-pumped using Raman pumps 20. This creates Raman gain in spans 16 that counteracts the attenuation normally experienced along spans 16. The arrangement shown in FIG. 1 is a counterpumping arrangement, but distributed Raman amplifiers of this type may also be provided using co-pumping or using a combination or counterpumping and co-pumping.

Raman pumps 20 are preferably unpolarized to avoid creating polarization-dependent gain in spans 16. Pump light from pumps 20 may be coupled into fiber spans 16 using pump couplers 22. Pump couplers 22 may be, for example, wavelength-division multiplexing (WDM) couplers or couplers based on circulators or other suitable pump coupling arrangements.

Figure 2:
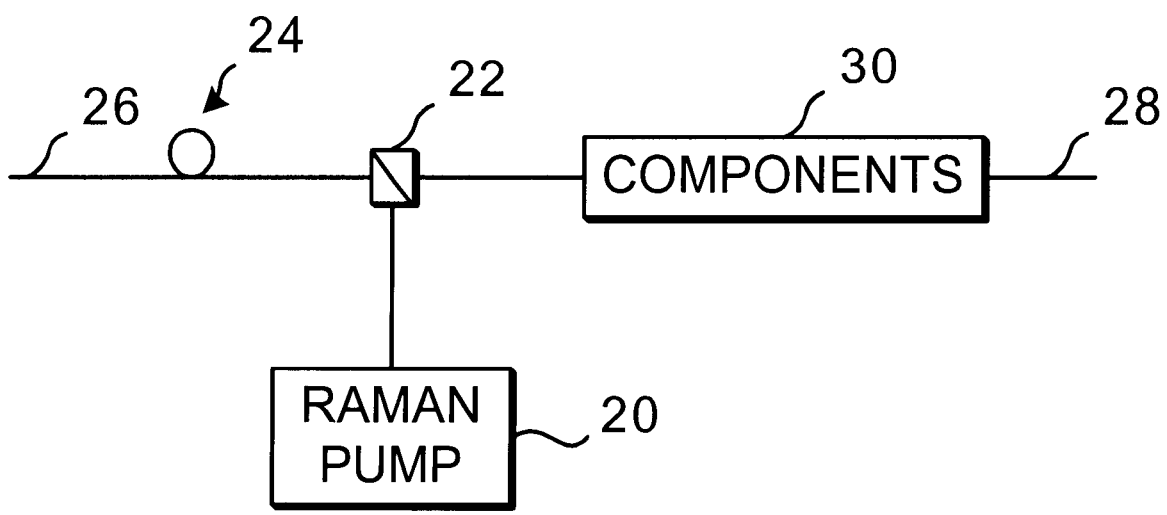
FIG. 2 is a schematic diagram of ah illustrative discrete Raman amplifier in accordance with the present invention.

An illustrative optical amplifier 18 with a discrete Raman gain stage is shown in FIG. 2. In the example of FIG. 2, optical gain is provided by optically-pumped Raman fiber coil 24. Any suitable optical fiber may be used as Raman fiber. For example, the Raman fiber may be small-core fiber or dispersion-compensating fiber or other suitable fiber for producing Raman gain in a coil inside an amplifier or other network equipment. An advantage of using dispersion-compensating fiber for Raman fiber 24 is that dispersion-compensating fiber may be used to compensate for chromatic dispersion on communications link 10.

Optical data signals from a preceding span of fiber 16 may be provided to optical input 26. Corresponding amplified optical signals that have passed along the main fiber path of amplifier 18 may be provided at fiber output 28.

Although amplifier 18 is shown as having one gain coil 24 in FIG. 2, amplifier 18 may have two or more coils if desired. Amplifier 18 may also have other gain media or stages such as semiconductor optical amplifier stages. Moreover, amplifier 18 may have various other optical components 30 such as taps, filters (e.g., gain-flattening filters), wavelength-division-multiplexing couplers, circulators, isolators, attenuators, dispersion-compensating elements, etc. These components may be located before, after, or between the coils or other gain media in the amplifier, but are not shown in FIG. 2 to avoid over-complicating the drawing.

Fiber 24 may be optically-pumped by unpolarized pump 20. Pump light from pump 20 may be coupled into fiber 24 using pump coupler 22.

Raman amplifier 18 of FIG. 2 may be used in a link such as link 10 of FIG. 1 or in a link such as link 10 without distributed Raman amplification.

Figure 3:
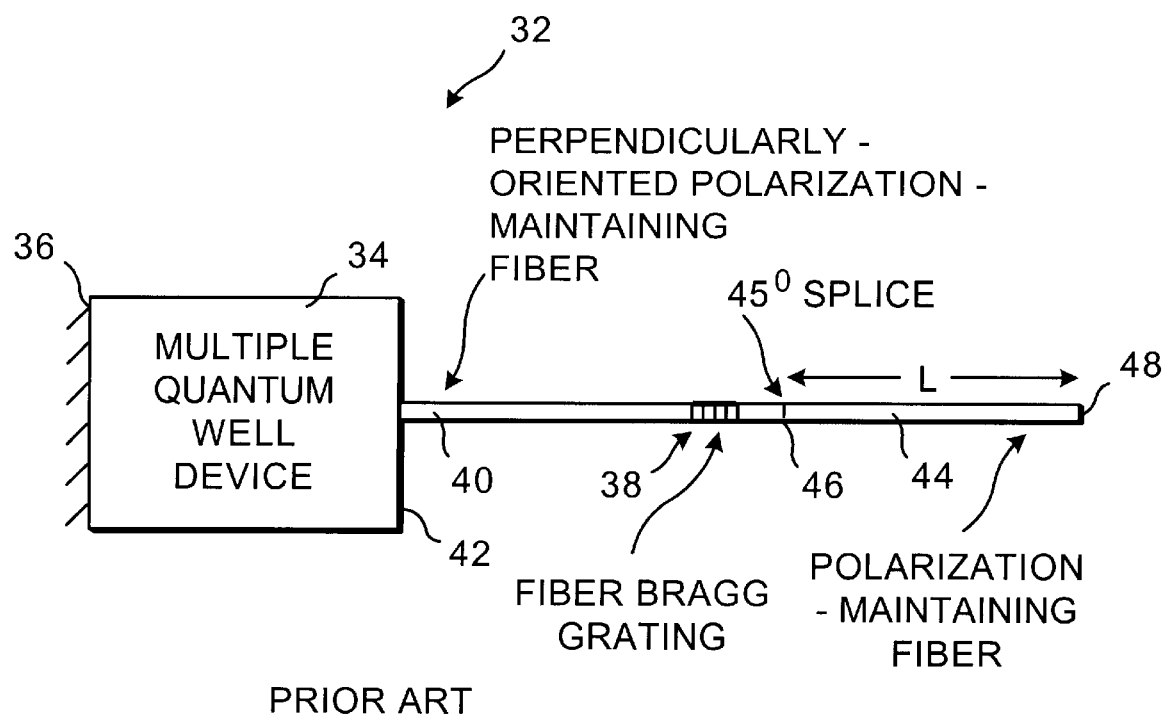
FIG. 3 is a diagram of an illustrative prior art unpolarized Raman pump source that uses a 45° splice between two polarization-maintaining fibers.

A prior art unpolarized Raman source is shown in FIG. 3. In pump 32 of FIG. 3, gain is provided by multiple quantum well device 34. Device 34 is a semiconductor device that uses multiple quantum wells to provide gain at a desired wavelength. Device 34 has a high-reflectivity mirror 36 and an antireflection (low-reflectivity) coating 42. A polarization-maintaining fiber 40 that is about a meter in length is coupled to device 34. Fiber 40 has a fiber-Bragg-grating reflector 38 with a reflectivity of about 2% at the wavelength of operation for device 32. This creates a coupled-cavity laser between mirror 36 and grating 38.

The light exiting polarization-maintaining fiber 40 is coupled into another length of polarization-maintaining fiber 44 at splice 46. The light exiting polarization-maintaining fiber 40 is linearly polarized. Polarization-maintaining fibers 40 and 44 are oriented so that their principle axes meet at a 45° angle at splice 46. With this arrangement, light that is launched from polarization-maintaining fiber 40 into polarization-maintaining fiber 44 is equally coupled into both the slow and fast principle axes of the polarization-maintaining fiber 44.

Polarization-maintaining fiber 44 is typically a few meters in length. After the pump light passes through this length of fiber, the signals traveling along the slow and fast axes become spatially separated by a length that is greater than the coherence length of the multiple quantum well device. As a result, when the pump light exits the end 48 of polarization-maintaining fiber 44, the light is unpolarized. This unpolarized light may be used to pump fiber in a Raman amplifier. However, it is difficult to form the 45° splice 46 between polarization-maintaining fibers 40 and 44 and splices of this type often exhibit relatively large losses and poor reliability.

In accordance with the present invention, an unpolarized Raman pump 20 is provided in which it is not necessary to form a splice between two lengths of polarization-maintaining fiber. An illustrative pump 20 of this type is shown in FIG. 4.

Figure 4:
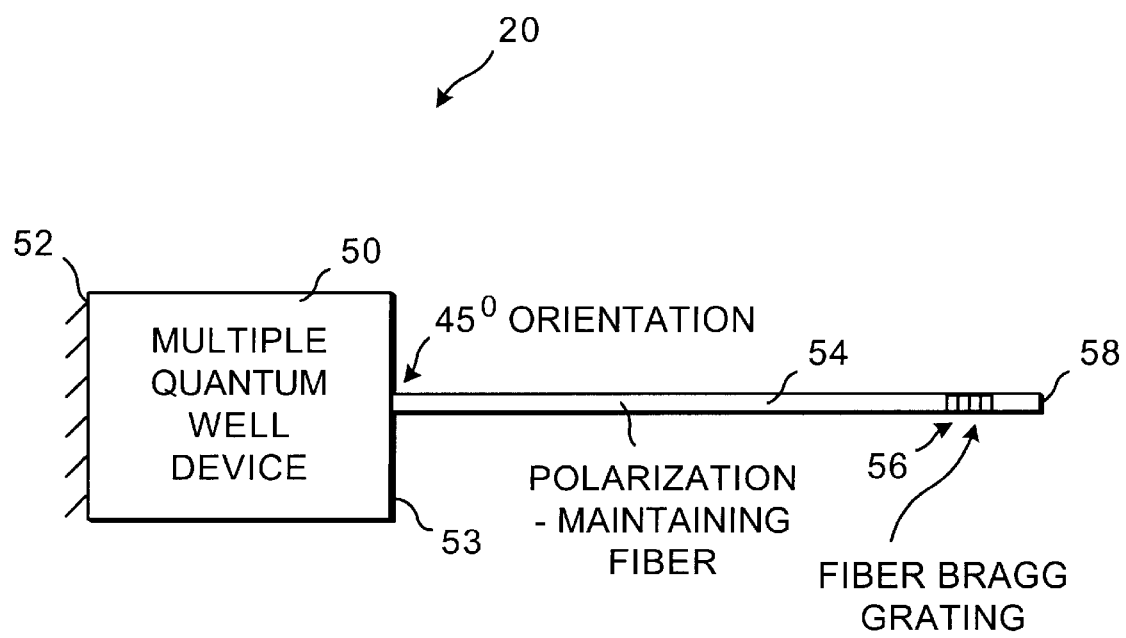
FIG. 4 is a diagram of an illustrative unpolarized Raman amplifier pump source in accordance with the present invention.

As shown in FIG. 4, pump 20 has a suitable gain medium such as a semiconductor device 50. Device 50 may be an GaInAsP/InP device, a GaInAlAs/InP device, or other suitable device that uses multiple quantum wells to provide polarized gain at the desired Raman pump wavelength or may be any other suitable semiconductor device that produces polarized gain at the Raman pump wavelength (e.g., pump wavelengths in the range of about 1.1–1.6 μm or any other suitable wavelength range). Device 50 may have a high-reflectivity mirror 52 and an antireflection (or low-reflectivity) coating 53. A polarization-maintaining fiber 54 that is about a meter or several or more meters in length is coupled to device 50. The length of fiber 54 may be selected to ensure that the light exiting fiber end 58 is unpolarized.

The semiconductor device 50 may include an integral wavelength-selective structure. For example, device 50 may include a reflector such as a distributed Bragg reflector (DBR), a full or partial distributed feedback (DFB) grating, or any other suitable structure integrated into device 50 that ensures that device 50 lases at a particular fixed wavelength, a tunable wavelength, or several fixed or tunable wavelengths. Mirror 52 may also have a wavelength-selective reflectivity to selectively reflect a certain wavelength or wavelengths to regulate the laser emission wavelengths. An external reflector may be used for wavelength selectivity in place of these structures if desired.

For example, fiber 54 may also have a reflector 56 such as a fiber-Bragg-grating reflector that is external to device 50. The light that is reflected from reflector 56 is directed back along fiber 54 and device 50. This creates a coupled-cavity laser between mirror 52, coating 53, and grating 56 (if coating 53 is a low-reflectivity coating) or an external cavity laser between mirror 52 and grating 56 (if coating 53 is an antireflection coating). Fiber-Bragg-grating reflector 56 may have an effective reflectivity Reff of about 0.4% to 6% at the wavelength of operation for device 50. The effective reflectivity $R_{eff}$ may be defined as the reflectivity seen by the lasing mode at the front facet (i.e., at coating 53). The effective reflectivity may be calculated based on the reflectivity of the fiber-Bragg-grating (R) and the coupling efficiency η between the laser mode and the fiber grating; as given in equation 1.

$$R_{eff} = \eta^2 R \tag{1}$$

If fiber 54 is a polarization-maintaining (PM) fiber that is aligned so that there is an angle of 45° between the slow (and fast) fiber axis and the orientation of the polarization axis of the laser mode of device 50, the effective coupling reflectivity η may be reduced by a factor of about 0.707. This reduction in the effective reflectivity accounts for the coupling losses due to polarization mode coupling between device 50 and fiber 54 and assumes that the PM fiber 54 is long enough to depolarize the light reflected from reflector 56.

The effective reflectivity is preferably about 0.8% to 3% to ensure wavelength and power stability.

Reflector 56 may be placed about a half meter to several meters from the laser facet position 53 along the fiber length (or just after the fiber length on another section of fiber) to ensure that the reflected light is depolarized when it reaches the laser cavity.

Depolarization may be defined as when the light includes light polarized in two orthogonal polarization directions which are incoherent with each other. Placing a one-half to several-meter length of fiber 54 between reflector 56 and coating 53 may tend to reduce power instabilities in pump 20 due to coupled-cavity effects at the interface between coating 53 and device 50.

Polarization-maintaining fiber 54 is coupled directly to device 50. The light exiting device 50 is linearly polarized, due to the polarization-dependent gain of device 50. Polarization-maintaining fiber 54 is oriented so that the principle axes of fiber 54 each make an angle of about 45° with respect to the linearly-polarized light exiting device 50. With this arrangement, light that is launched from device 50 into polarization-maintaining fiber 54 is about equally coupled into both the slow and fast principle axes of the polarization-maintaining fiber 54. Although fiber 54 and device 50 are often described herein as being aligned at a 45° angle, any suitable angle for depolarizing the light from device 50 may be used. For example, an angle of between 35° and 55° or between 40° and 50° or other suitable angle may be used. If desired, the coupling angle that is used may be close enough to 45° to produce a degree of polarization (DOP) that is below about 0.1. This may be satisfactory for many applications.

The length of fiber 54 is selected so that after the pump light from device 50 passes through the length of fiber 54, the signals traveling along the slow and fast axes become spatially separated by a length that is greater than the coherence length of the multiple quantum well device 50. As a result, when the pump light exits the end 58 of polarization-maintaining fiber 54, the light is unpolarized. This unpolarized light may be provided to a suitable pump coupler 22, so that the light may be used to pump fiber in a Raman amplifier such as the distributed Raman amplifiers of FIG. 1 or Raman amplifier 18 of FIG. 2.

Figure 5:
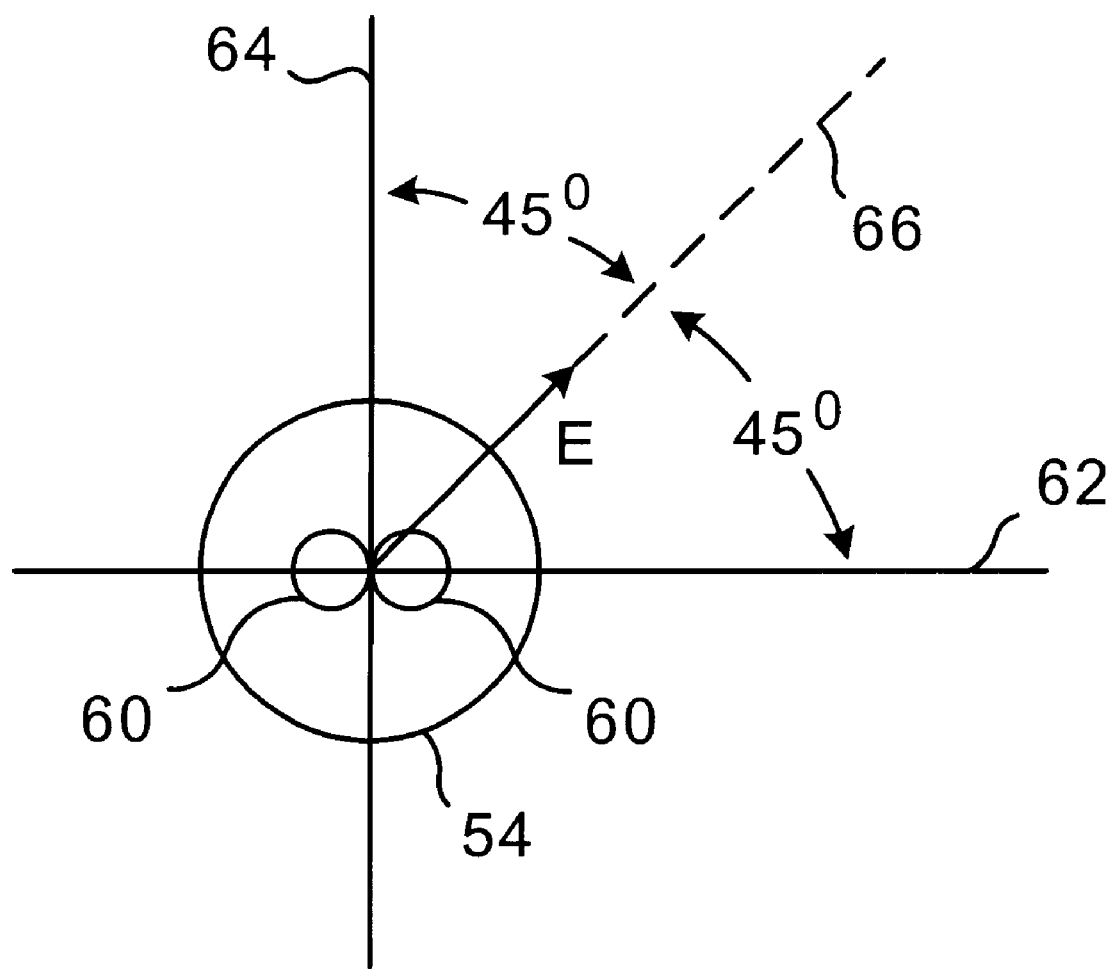
FIG. 5 is cross-sectional view of an illustrative polarization-maintaining fiber in accordance with the present invention.

A cross-sectional view of an illustrative polarization-maintaining (PM) fiber 54 is shown in FIG. 5. Fiber 54 in the example of FIG. 5 is PANDA fiber, but any suitable PM fiber may be used. As shown in FIG. 5, the electric field E of the linearly polarized pump light exiting device 50 of FIG. 4 is aligned with dotted line 66. Dotted line 66 makes 45° angles with respect to the slow and fast axes of fiber 54, which are aligned with axes 62 and 64. Although exactly 45° may be preferred, any suitable angle of about 45° (e.g., an angle between about 35° and 55° or between about 40° and 50° or more or less) may be used if desired.

When linearly polarized light that is aligned with line 66 is launched into fiber 54, the light effectively splits in two portions of approximately equal powers. The first portion is made up of linearly polarized light that is aligned with axis 64 and the second portion is made up of linearly polarized light that is aligned with axis 62. Because fiber 54 is birefringent, the light aligned with axis 64 will propagate at a different velocity than the light aligned with axis 62. After a sufficient length in fiber 54, the slow and fast portions of the pump signal will have separated by more than the coherence length of device 50, so that when the light is recombined at this point, it is unpolarized.

Figure 6:
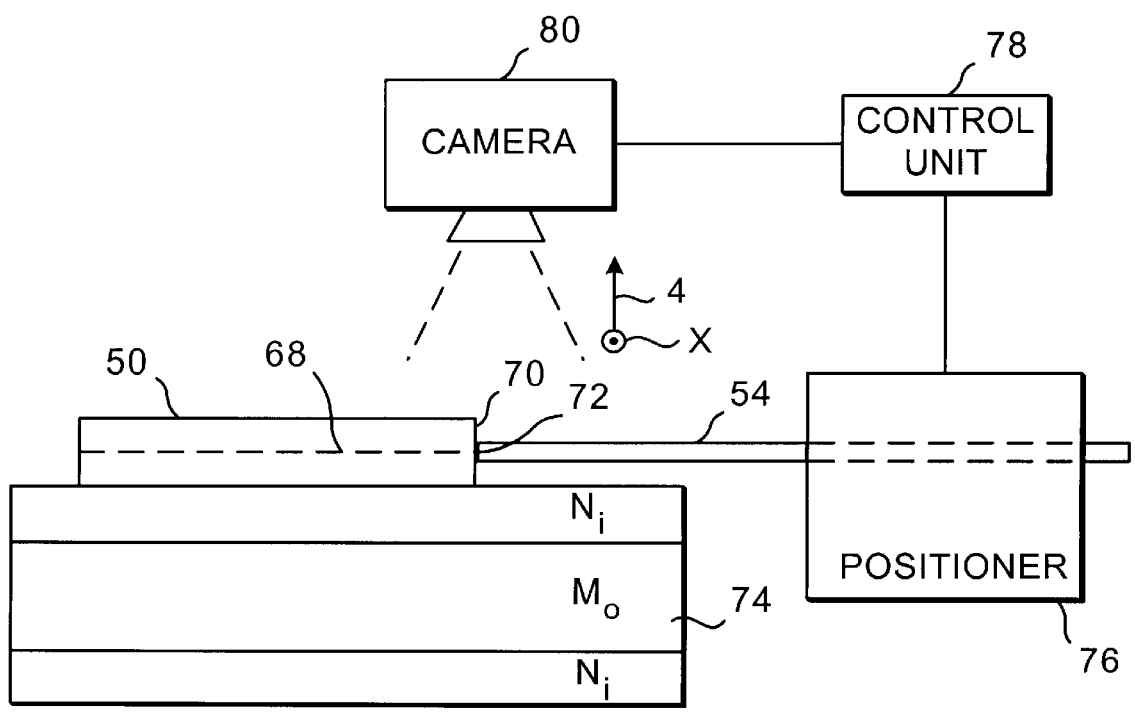
FIG. 6 is a side view of an illustrative system for aligning polarization-maintaining fiber to a semiconductor amplifier device in accordance with the present invention.

Illustrative equipment that may be used in assembling fiber 54 and device 50 is shown in FIG. 6. Light exiting device 50 is emitted from multiple quantum wells 68 at end 70 of device 50 and coupled into end 72 of fiber 54. The linearly polarized E field of the light emitted from device 50 is oriented so that is points into the page of FIG. 6.

Device 50 may be mounted on a mounting structure 74. The mounting structure may be any suitable mounting structure, such as a nickel-coated molybdenum mount. The nickel on the surfaces of mount 74 may assist in soldering and electrically connecting device 50 to mount 74 and in electrically connecting mount 74 to a circuit board or other structure.

A positioner 76 may be used to position fiber 54 with respect to device 50. Positioner 76 may be used to move fiber 54 closer or farther from the end of device 50 and may be used to rotate fiber 54 so that axes 62 and 64 are properly aligned at 45° angles to the linearly polarized light exiting device 50, as described in connection with FIG. 5.

Positioner 76 may be manually controlled or may be controlled using motors. Positioner 76 may be controlled by an operator or automatically. A control unit such as control unit 78 may be used to control positioner 76. Control unit 78 may be based on any suitable control electronics and may include one or more microprocessors, microcontrollers, digital signal processors, programmable logic devices, application-specific integrated circuits, digital-to-analog converters, analog-to-digital converters, analog control circuits, memory devices, etc.

A still or video camera 80 or a microscope or other optical inspection device may be used to view fiber 54 and device 50. In the configuration of FIG. 6, camera 80 views fiber 54 from above. This type of top view may be used to orient fiber 54 so that cores 60 (FIG. 5) are oriented along axis x. Control unit 78 or an operator may accomplish this orientation by maximizing the observed width of the core region. When a maximum observed core width from the top view orientation (viewing along axis y) is obtained, axis 62 of FIG. 5 is aligned with axis x of FIG. 6 and axis 64 of FIG. 5 is aligned with axis y of FIG. 6. From this point, positioner 76 may rotate fiber 54 45° about its longitudinal axis before further coupling efficiency optimization. This orients fiber 54 with respect to device 50 so that the E field of the linearly polarized light exiting device 50 is at a 45° angle with respect to axes 62 and 64, as shown in FIG. 5.

Figure 7:
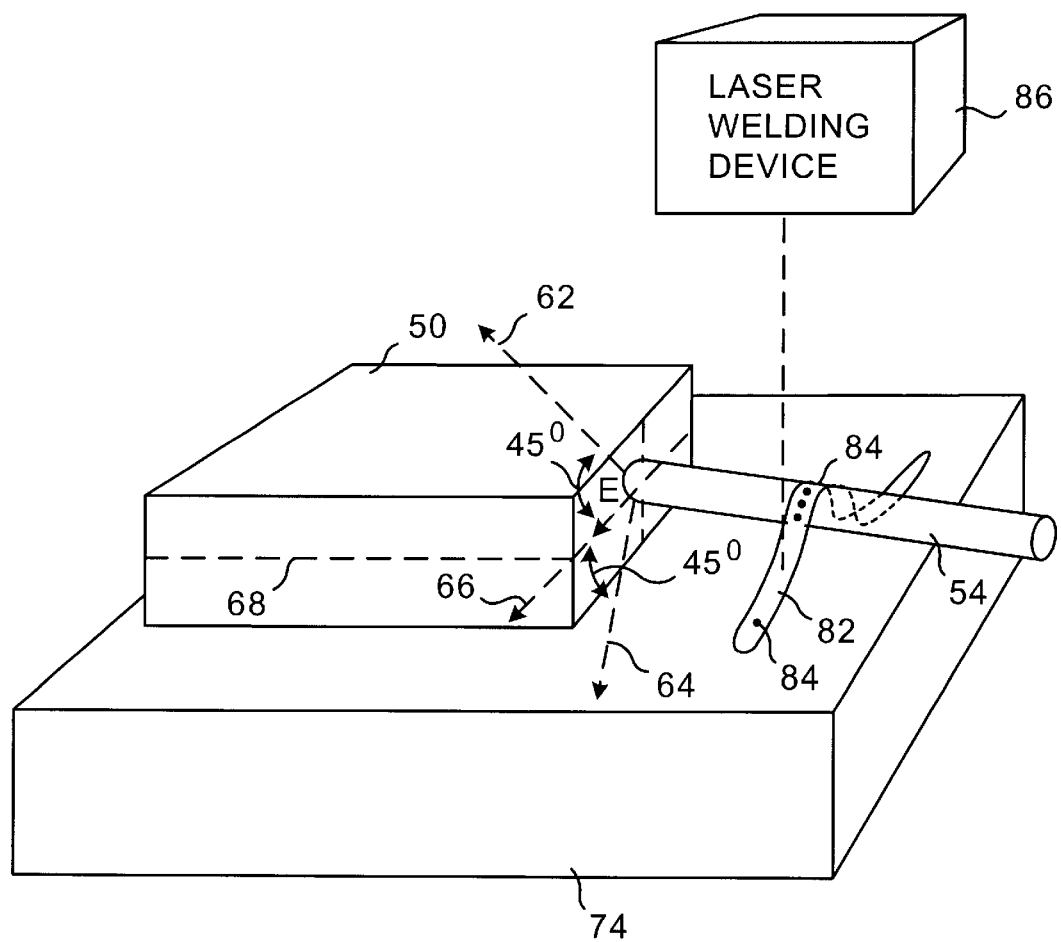
FIG. 7 is a perspective view of an illustrative arrangement for mounting a polarization-maintaining fiber to a semiconductor amplifier device in accordance with the present invention.

After fiber 54 has been properly aligned with device 50, fiber 54 may be mounted to mounting structure 74, as shown in FIG. 7. Fiber 54 may be mounted to mounting structure 74 using a clip such as nickel clip 82 or any other suitable mounting structure or arrangement. For example, adhesive may be used to affix fiber 54 to structure 74. Grooves or other features in structure 74 may also be used to help align or mount fiber 54.

Clip 82 may be affixed to mount 74 using adhesive, solder, welds, or any other suitable mounting technique. As shown in FIG. 7, welds 84 may be formed between clip 84 and structure 74 and between clip 84 and fiber 54 using a laser welder 86. Fiber 54 may be gold plated for welding. Laser welder 86 may be any suitable welder such as a commercially available argon laser welding device.

Figure 8:
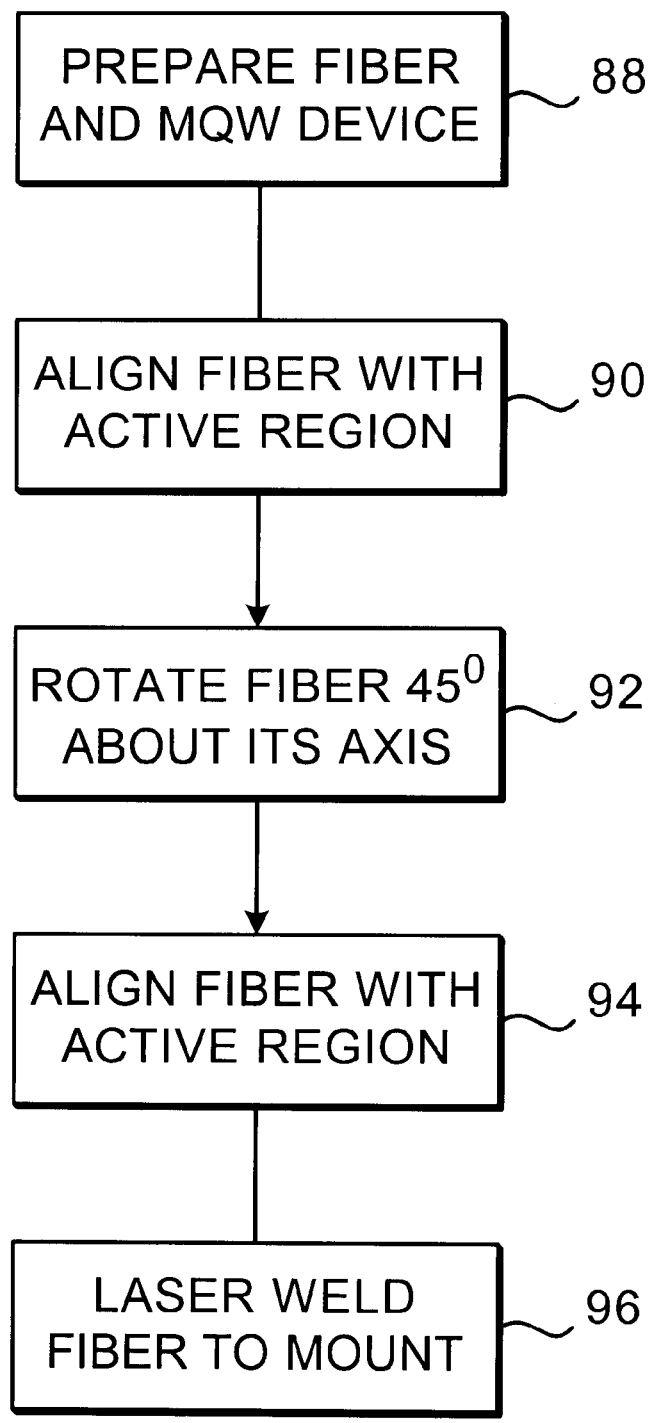
FIG. 8 is a flow chart of illustrative steps involved in assembling an unpolarized Raman pump source in accordance with the present invention.

Illustrative steps involved in assembling the Raman pump 20 are shown in FIG. 8. At step 88, fiber 54 and device 50 are prepared for assembly. For example, fiber 54 may be stripped, cleaned, and cleaved. Device 50 may be cleaved and soldered to mounting structure 74.

At step 90, fiber 54 may be aligned with the active region of device 50. The active region of device 20 may be defined vertically by the vertical location of the multiple quantum wells 68 or other active gain media. Light may be laterally confined using a waveguide structure that runs along the length of device 50 parallel to fiber 54.

Current may be applied to device 50 during alignment, so that light is exiting the active region of device 50. A power meter or other suitable detector may be placed at end 58 of fiber 54 to monitor how much light is exiting fiber 54. This amount may be maximized by rotating and translating fiber 54 and fiber 54 may be viewed with camera 80 or other device to ensure that the observed width of core 60 is maximized.

After aligning fiber 54 with device 50 using visual alignment techniques and by monitoring the coupling between device 50 and fiber 54 when device 50 is on, positioner 76 may be used to rotated fiber 54 by 45° at step 92.

At step 94, the fiber 54 may be further aligned with the device active region.

At step 96, after the fiber 54 has been properly oriented with respect to device 50, fiber 54 may be fixed in place. For example, fiber 54 may be mounted to mounting structure 74 using a clip such as clip 84 or other device. Laser welding or other suitable mounting techniques may be used to mount fiber 54 so that it is permanently held in place when Raman pump 20 is used in a fiber-optic communications network to provide Raman pump light for a Raman amplifier.

After pump 20 has been assembled, end 58 of fiber 54 may be spliced to a pigtail on a suitable pump coupler 22. If desired, a length of single mode fiber may be inserted between pump coupler 22 and end 58.

Alignment marks or other suitable techniques may be used to align fiber 54 to device 50 at the correct angle. For example, fiber 54 may be marked along the top surface of fiber 54 or at other suitable positions around the fiber circumference using laser or mechanical marking equipment. The markings on fiber 54 may be used to indicate the locations of the fast and slow axes or proper angular orientations for fiber 54. The alignment marks may be used to visually align fiber 54 to device 50. If desired, the tip of fiber 54 may be formed into a wedge or other shape suitable for optically coupling light into device 50. The distinctive shape of the wedge or other optical coupling structure may be used when visually aligning fiber 54 to device 50 at the proper angle.

Figure 9A:
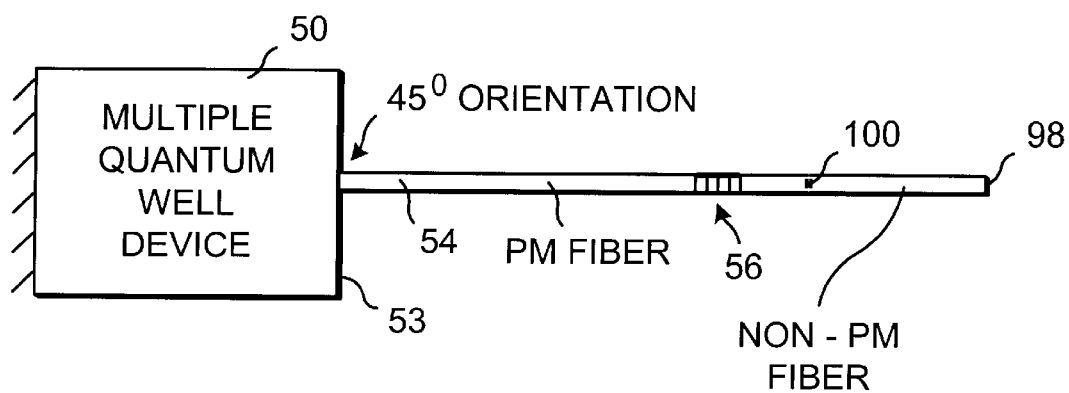
FIG. 9a is a diagram showing how a short length of non-polarization-maintaining fiber may be spliced to the end of the polarization-maintaining fiber used to depolarize the light from a semiconductor device (e.g., a multiple quantum well device) in accordance with the present invention.

As shown in FIG. 9*a*, a length of non-polarization-maintaining fiber 98 (e.g., standard single mode fiber) may be spliced to the end of fiber 54 at splice 100. Fiber 98 may be a short length of fiber (e.g., a length of fiber from a fraction of a meter to multiple meters in length) that is spliced to fiber 54 during the process of manufacturing the assembly of FIG. 10*a*. This assembly may be shipped to the end user as an integrated unit, so that the end user does not need to form a potentially difficult PM to non-PM splice in the field.

Figure 9B:
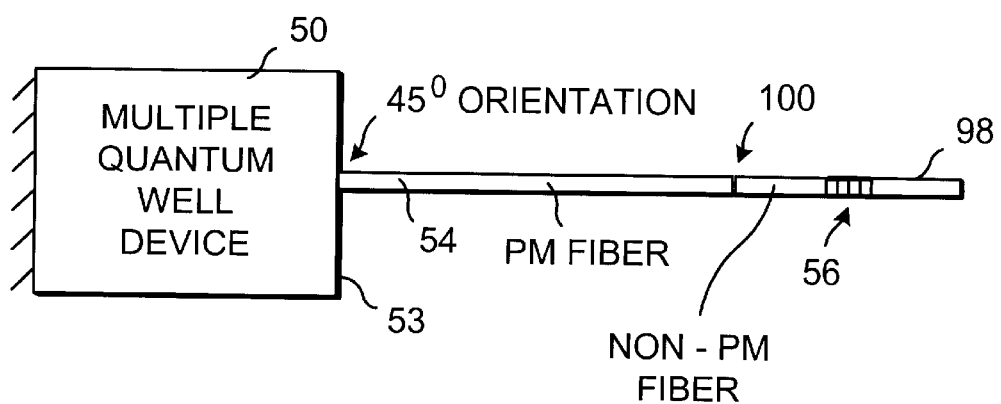
FIG. 9b is a diagram showing how a length of non-polarization-maintaining fiber having a grating reflector such as a fiber-Bragg-grating may be sliced to the end of the polarization-maintaining fiber used to depolarize the light from a multiple quantum well device in accordance with the present invention.

Another illustrative arrangement is shown in FIG. 9*b*. With the FIG. 9*b* configuration, non-PM fiber 98 has an integral reflector 56 (e.g., a fiber-Bragg grating reflector). The distance between reflector 56 and splice 100 is preferably short (e.g., a few centimeters to two meters) to assure proper stable feedback.

Figure 10A:
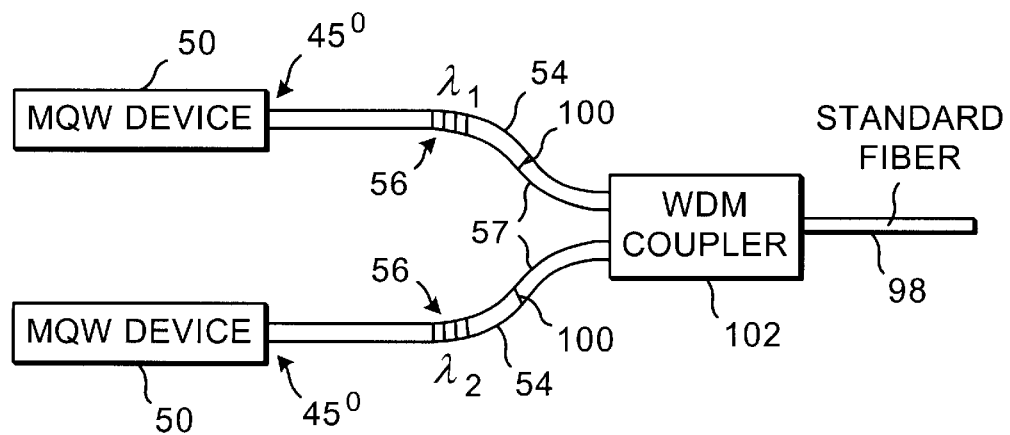
FIG. 10a is a diagram showing how light at different wavelengths from multiple sources that use polarization-maintaining fiber to depolarize light may be combined in accordance with the present invention.

If desired, a number of multiple semiconductor devices 50 (e.g., quantum well devices), each of which is used to produce light at a different wavelength, may be combined. A suitable arrangement in which multiple devices 50 are combined is shown in FIG. 10a. Each device 50 has an associated grating or other reflector 56 that is configured to reflect light at a particular wavelength. Fiber 54 is used to depolarize the light from devices 50. A wavelength-division multiplexing (WDM) coupler 102 or other suitable coupler may be used to combine the light from each polarization-maintaining fiber 54 onto a fiber 98 (e.g., a single mode fiber such as a length of standard single mode transmission fiber). The input fiber pigtails 57 for coupler 102 may be single mode fiber such as standard single mode transmission fiber that is spliced to laser output fiber 54 at splices 100.

Figure 10B:
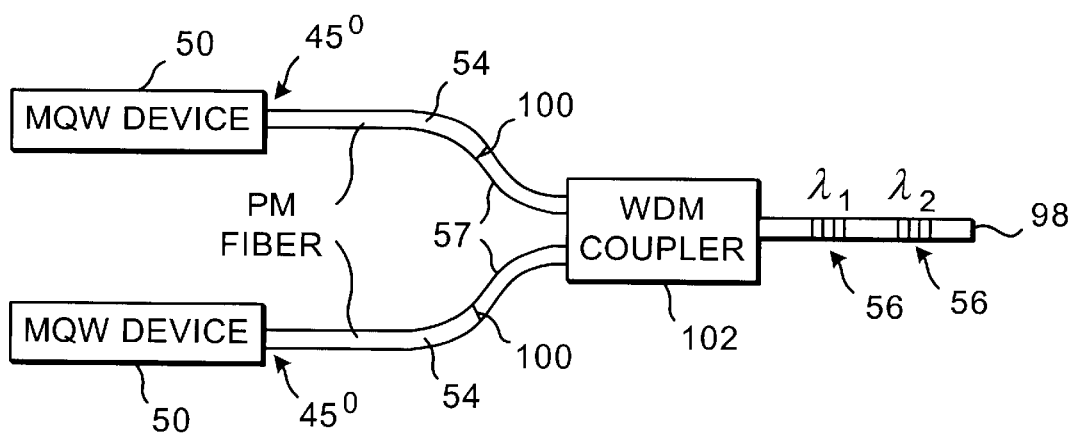
FIG. 10b is a diagram of an illustrative arrangement in which light from multiple sources that is depolarized using polarization-maintaining fiber may be combined and then reflected using a fiber-based reflector arrangement in accordance with the present invention.

Reflectors 56 may be placed after coupler 102. An illustrative arrangement in which reflectors 56 on a length of fiber 98 are placed after a wavelength division multiplexing coupler 102 is shown in FIG. 10b. The PM fiber 54 between devices 50 and coupler 102 is used to depolarize the light from devices 50. The input fiber pigtails 57 for coupler 102 may be single mode fiber such as standard single mode transmission fiber that is spliced to laser output fiber 54 at splices 100.

Figure 11A:
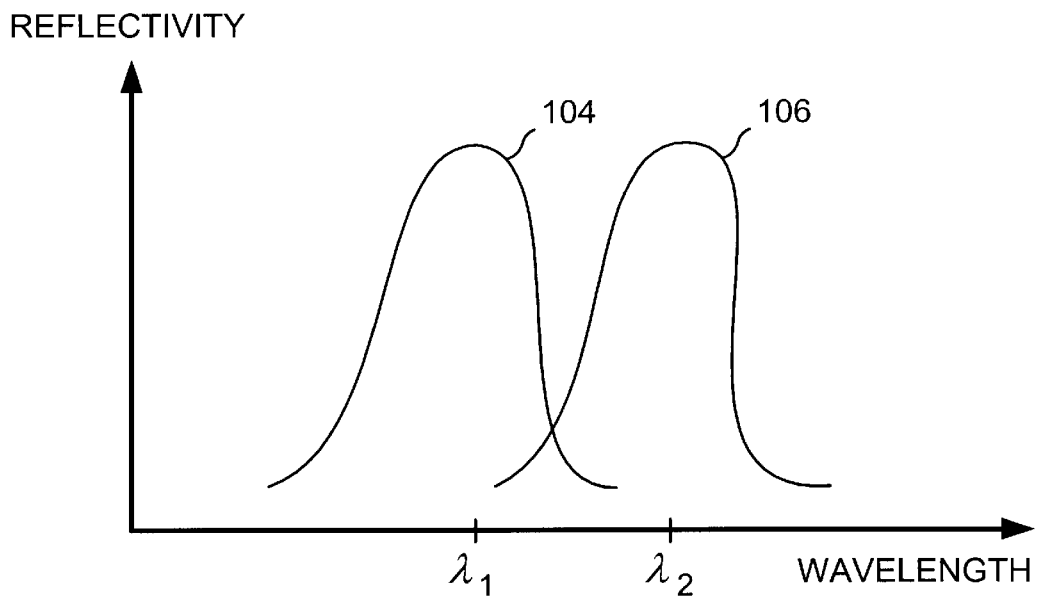
FIGS. 11a and 11b are graphs showing the reflectivities of illustrative fiber-based reflector arrangements that may be used in configurations of the type shown in FIG. 10b in accordance with the present invention.

The reflector arrangement of FIG. 10b may use separate reflectors 56, each of which has a separate reflectivity peak. For example, one reflector 56 may be a fiber Bragg grating with a reflectivity peak of $\lambda_1$ and another reflector 56 may be a fiber Bragg grating with a reflectivity peak of $\lambda_2$, as shown by curves 104 and 106 of FIG. 11a.

Figure 11B:
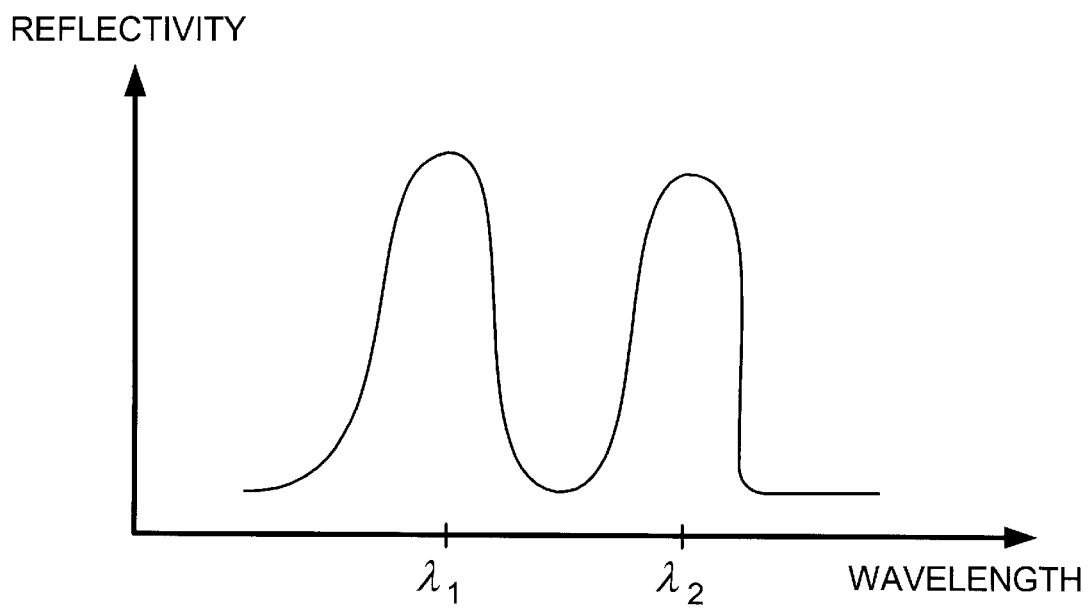

If desired, a single reflector 56 may be used that reflects light at both $\lambda_1$ and $\lambda_2$. A reflectivity graph for such a reflector (which may be, for example, a fiber-Bragg grating reflector) is shown in FIG. 11b.

Although the examples of FIGS. 10a, 10b, 11a, and 11b include sources operating at two different wavelengths, any suitable number of such sources may be used if desired. Any suitable wavelength multiplexer may be used to combine the light from such sources. For example, an arrayed waveguide grating (AWG) combiner may be used to combine light at two or more wavelengths.

Figure 12:
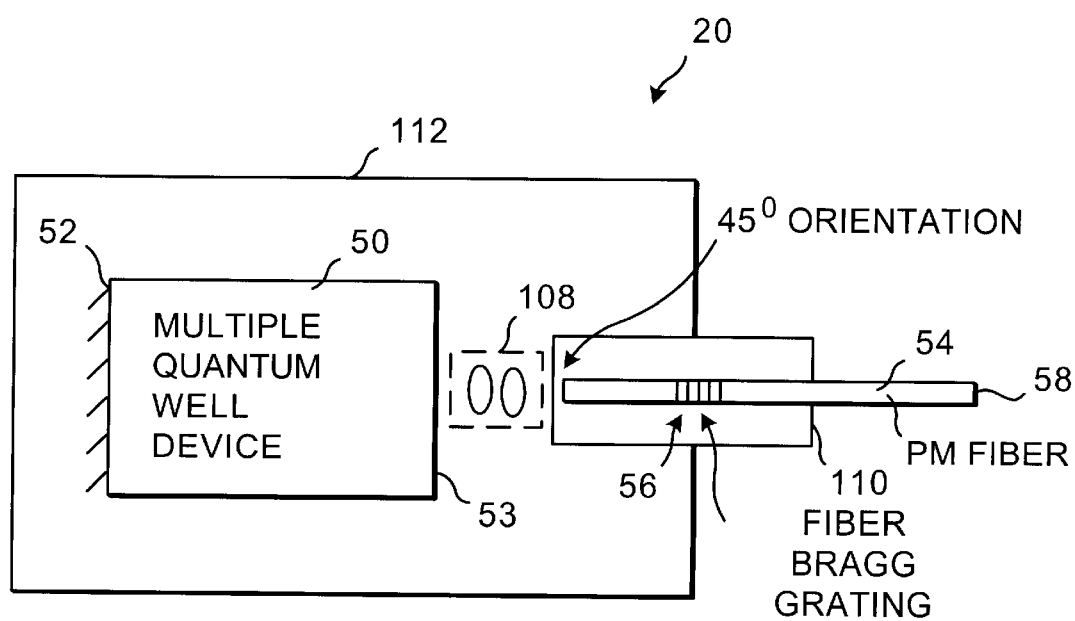
FIG. 12 is a schematic diagram showing how a pump may include a reflector that is integral with the end of a length of polarization-maintaining fiber that is attached to a semiconductor device in accordance with the present invention.

As shown in FIG. 12, pump 20 may be formed using a fiber Bragg grating 56 or other suitable reflector that is adjacent to device 50. In the illustrative configuration of FIG. 12, fiber Bragg grating 56 is formed on the end of polarization-maintaining fiber 54 that is nearest to device 50. A lens-based optical coupler 108 or other suitable optical coupling arrangement may be used to couple light from fiber 54 into device 50. The fast and slow axes of fiber 54 may be oriented at a 45° angle (or a 35–55° angle or a 40–50° angle or other suitable angle) with respect to the polarization of the light emitted by the multiple quantum well device. A protective ferrule 110 may be used to hold the end of fiber 54 in which grating 56 is formed. This helps to prevent power instabilities in pump 20. Ferrule 110, coupler 108, and device 50 may be mounted in a package 112. The length of fiber 54 may be one-half meter to several meters in length (i.e., just longer than the depolarization length in polarization-maintaining fiber 84 of the light emitted from device 50), so that the light exiting end 58 into a single mode fiber will be depolarized due to the dispersion-induced shift of the respective portions of the light from device 50 that travel along the slow and fast axes of fiber 54. If desired, the manufacturer of pump 20 may add a single mode fiber pigtail to pump 20 at end 58 to facilitate installation of pump 20 into optical communications network equipment.

It will be understood that the foregoing is merely illustrative of the principles of this invention, and that various modifications can be made by those skilled in the art without departing from the scope and spirit of the invention.

What is claimed is:

1. A Raman pump that produces unpolarized Raman pump light at a Raman pump wavelength for pumping a Raman amplifier in a fiber-optic communications network to produce Raman gain for optical signals, comprising:

a semiconductor device that produces linearly-polarized pump light at the Raman pump wavelength, wherein the linearly-polarized pump light has an electric field that is oriented in a given direction;

a polarization-maintaining fiber coupled to the semiconductor device that receives the pump light from the semiconductor device; and a reflector that is coupled to an end of the polarization-maintaining fiber and that reflects a portion of the pump light back along the polarization-maintaining fiber and into the semiconductor device, wherein the polarization-maintaining fiber has perpendicular fast and slow axes and wherein the polarization-maintaining fiber and semiconductor device are coupled so that the fast and slow axes are oriented at an angle of between 35° and 55° with respect to the given direction.

2. The Raman pump defined in claim 1 wherein the polarization-maintaining fiber and semiconductor device are coupled so that the fast and slow axes are oriented at an angle of between 40° and 50° with respect to the given direction.

3. The Raman pump defined in claim 1 wherein the polarization-maintaining fiber and semiconductor device are coupled so that the fast and slow axes are oriented at an angle of 45° with respect to the given direction.

4. The Raman pump defined in claim 1 wherein the semiconductor device is a multiple quantum well device.

5. The Raman pump defined in claim 1 wherein the reflector comprises a fiber Bragg grating.

6. The Raman pump defined in claim 1 wherein the reflector comprises a fiber Bragg grating reflector formed in the polarization-maintaining fiber.

7. The Raman pump defined in claim 1 wherein the semiconductor device emits Raman pump light having a coherence length and wherein the polarization-maintaining fiber has a length sufficient to spatially separate Raman pump light propagating along the slow and fast axes by more than the coherence length.

8. The Raman pump defined in claim 1 further comprising a mounting structure to which the semiconductor device and polarization-maintaining fiber are mounted, wherein the polarization-maintaining fiber is mounted to the mounting structure using a laser-welded clip.

9. The Raman pump defined in claim 1 further comprising a length of single-mode fiber spliced to the polarization-maintaining fiber, wherein the reflector is located on the polarization-maintaining fiber.

10. The Raman pump defined in claim 1 further comprising a length of single-mode fiber spliced to the polarization-maintaining fiber, wherein the reflector is located on the single-mode fiber.

11. A Raman amplifier for a fiber-optic communications link comprising:

fiber that is optically-pumped by unpolarized Raman pump light at a Raman pump wavelength to produce Raman gain for optical signals in the fiber-optic communications link;

a pump coupler that couples the Raman pump light into the fiber; and a Raman pump that produces the unpolarized Raman pump light and that provides the unpolarized Raman pump light to the pump coupler, wherein the Raman pump comprises:
- a semiconductor device that produces linearly-polarized pump light at the Raman pump wavelength, wherein the linearly-polarized pump light has an electric field that is oriented in a given direction;
- a polarization-maintaining fiber coupled to the semiconductor device that receives the pump light from the semiconductor device; and
- a reflector that is coupled to an end of the polarization-maintaining fiber and that reflects a portion of the pump light back along the polarization-maintaining fiber and into the semiconductor device, wherein the polarization-maintaining fiber has perpendicular fast and slow axes and wherein the polarization-maintaining fiber and semiconductor device are coupled so that the fast and slow axes are oriented at 45° angles with respect to the given direction.

12. The Raman amplifier defined in claim 11 wherein the semiconductor device has a multiple quantum well active region and wherein the given direction is aligned with multiple quantum well active region.

13. The Raman amplifier defined in claim 11 wherein the reflector comprises a fiber Bragg grating.

14. The Raman amplifier defined in claim 11 wherein the reflector comprises a fiber Bragg grating reflector formed in the polarization-maintaining fiber.

15. The Raman amplifier defined in claim 11 wherein the pump coupler comprises a wavelength-division multiplexing coupler.

16. The Raman amplifier defined in claim 11 wherein the fiber comprises dispersion-compensating fiber.

17. The Raman amplifier defined in claim 11 wherein the fiber comprises transmission fiber.

18. The Raman amplifier defined in claim 11 wherein the semiconductor device emits Raman pump light having a coherence length and wherein the polarization-maintaining fiber has a length sufficient to spatially separate Raman pump light propagating along the slow and fast axes by more than the coherence length.

19. The Raman amplifier defined in claim 11 further comprising a mounting structure to which the semiconductor device and polarization-maintaining fiber are mounted, wherein the polarization-maintaining fiber is mounted to the mounting structure using a laser-welded clip.

20. The Raman amplifier defined in claim 11 wherein the fiber comprises transmission fiber, wherein the semiconductor device emits Raman pump light having a coherence length, and wherein the polarization-maintaining fiber has a length sufficient to spatially separate Raman pump light propagating along the slow and fast axes by more than the coherence length.

21. The Raman amplifier defined in claim 11 wherein the fiber comprises dispersion-compensating fiber, wherein the semiconductor device emits Raman pump light having a coherence length, and wherein the polarization-maintaining fiber has a length sufficient to spatially separate Raman pump light propagating along the slow and fast axes by more than the coherence length.

22. The Raman amplifier defined in claim 11 wherein the reflector comprises a fiber Bragg grating reflector formed in the polarization-maintaining fiber and wherein the pump coupler comprises a wavelength-division multiplexing coupler.

23. The Raman amplifier defined in claim 11 wherein the semiconductor device has a multiple quantum well active region and wherein the given direction is aligned with multiple quantum well active region and wherein the reflector comprises a fiber Bragg grating.

24. A method of assembling an unpolarized pump source comprising:
- aligning a semiconductor device that produces linearly-polarized light having an electric field oriented in a given direction with a polarization maintaining fiber to maximize light transmission through the polarization-maintaining fiber, wherein the polarization-maintaining fiber has fast and slow axes; and
- rotating the polarization-maintaining fiber by 45° after the light transmission is maximized so that the fast and slow axes are oriented at 45° with respect to the given direction; and
- using a mounting structure to ensure that the orientation of the semiconductor device and polarization-maintaining fiber remains fixed after the fiber has been rotated by 45°.

25. A Raman pump that produces unpolarized Raman pump light at a Raman pump wavelength for pumping a Raman amplifier in a fiber-optic communications network to produce Raman gain for optical signals, comprising:
- a semiconductor device that produces linearly-polarized pump light at the Raman pump wavelength, wherein the linearly-polarized pump light has an electric field that is oriented in a given direction and wherein the semiconductor device has a integral wavelength-selective structure; and
- a polarization-maintaining fiber coupled to the semiconductor device that receives the pump light from the semiconductor device, wherein the polarization-maintaining fiber has perpendicular fast and slow axes and wherein the polarization-maintaining fiber and semiconductor device are coupled so that the fast and slow axes are oriented at an angle of between 35° and 55° with respect to the given direction.

26. A Raman pump that produces unpolarized Raman pump light at a Raman pump wavelength for pumping a Raman amplifier in a fiber-optic communications network to produce Raman gain for optical signals, comprising:
- a semiconductor device that produces linearly-polarized pump light at the Raman pump wavelength, wherein the linearly-polarized pump light has an electric field that is oriented in a given direction;
- a polarization-maintaining fiber coupled to the semiconductor device that receives the pump light from the semiconductor device; and
- a fiber Bragg grating that is formed on an end of the polarization-maintaining fiber adjacent to the semiconductor device and that reflects a portion of the pump light back into the semiconductor device, wherein the polarization-maintaining fiber has perpendicular fast and slow axes and wherein the polarization-maintaining fiber and semiconductor device are coupled so that the fast and slow axes are oriented at an angle of between 35° and 55° with respect to the given direction.

* * * * *